(12) United States Patent
Taniguchi et al.

(10) Patent No.: US 6,920,594 B2
(45) Date of Patent: Jul. 19, 2005

(54) SCAN FLIP-FLOP CIRCUIT, LOGIC MACRO, SCAN TEST CIRCUIT, AND METHOD FOR LAYING OUT THE SAME

(75) Inventors: Hiroki Taniguchi, Kyoto (JP); Masuko Taniguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 474 days.

(21) Appl. No.: 10/158,117

(22) Filed: May 31, 2002

(65) Prior Publication Data

US 2002/0184584 A1 Dec. 5, 2002

(30) Foreign Application Priority Data

May 31, 2001 (JP) ........................................ 2001-163887

(51) Int. Cl.[7] ............................................. G01R 31/28
(52) U.S. Cl. ..................................................... 714/726
(58) Field of Search .............................. 714/724, 726, 714/727, 732, 733; 365/207; 438/151

(56) References Cited

U.S. PATENT DOCUMENTS 5,294,837 A * 3/1994 Takase et al. ............... 257/774
6,182,256 B1 * 1/2001 Qureshi ....................... 714/726
6,389,566 B1 * 5/2002 Wagner et al. ............... 714/726

FOREIGN PATENT DOCUMENTS

JP 63-263480 10/1988

* cited by examiner

Primary Examiner—Guy J. Lamarre
Assistant Examiner—James C Kerveros
(74) Attorney, Agent, or Firm—McDermott Will & Emery LLP (57) ABSTRACT

A scan flip-flop circuit has a scan test data output terminal QT in addition to a Q terminal and a /Q terminal. To the QT terminal, the data that have been held in an internal data holding circuit is transferred via a tristate buffer that has been incorporated in advance. The drive capability of the tristate buffer is determined so that a propagation delay time is obtained and the scan test data outputted from the QT terminal is propagated to the scan test data input terminal DT of the next stage scan flip-flop circuit. Consequently, during scan testing, a sufficient delay is added to the output from the scan flip-flop circuit, and hold errors do not easily occur.

1 Claim, 11 Drawing Sheets

SCAN FLIP-FLOP CIRCUIT, LOGIC MACRO, SCAN TEST CIRCUIT, AND METHOD FOR LAYING OUT THE SAME

This application claims priority to Japanese Patent Application Serial No. 2001-163887, filed May 31, 2001.

BACKGROUND OF THE INVENTION

The present invention relates to scan flip-flop circuits, logic macros, and scan test circuits that do not easily cause hold errors of scan test data at the time of shifting operation of scan testing, and methods for laying out the same.

In recent years, the advancement of miniaturization and increasing integration of semiconductor integrated circuits have necessitated scan test design, which is a technique of design for testability of semiconductor integrated circuits. A conventional scan test circuit and a conventional method for laying out the circuit in the scan test design are described below.

Figure 10:
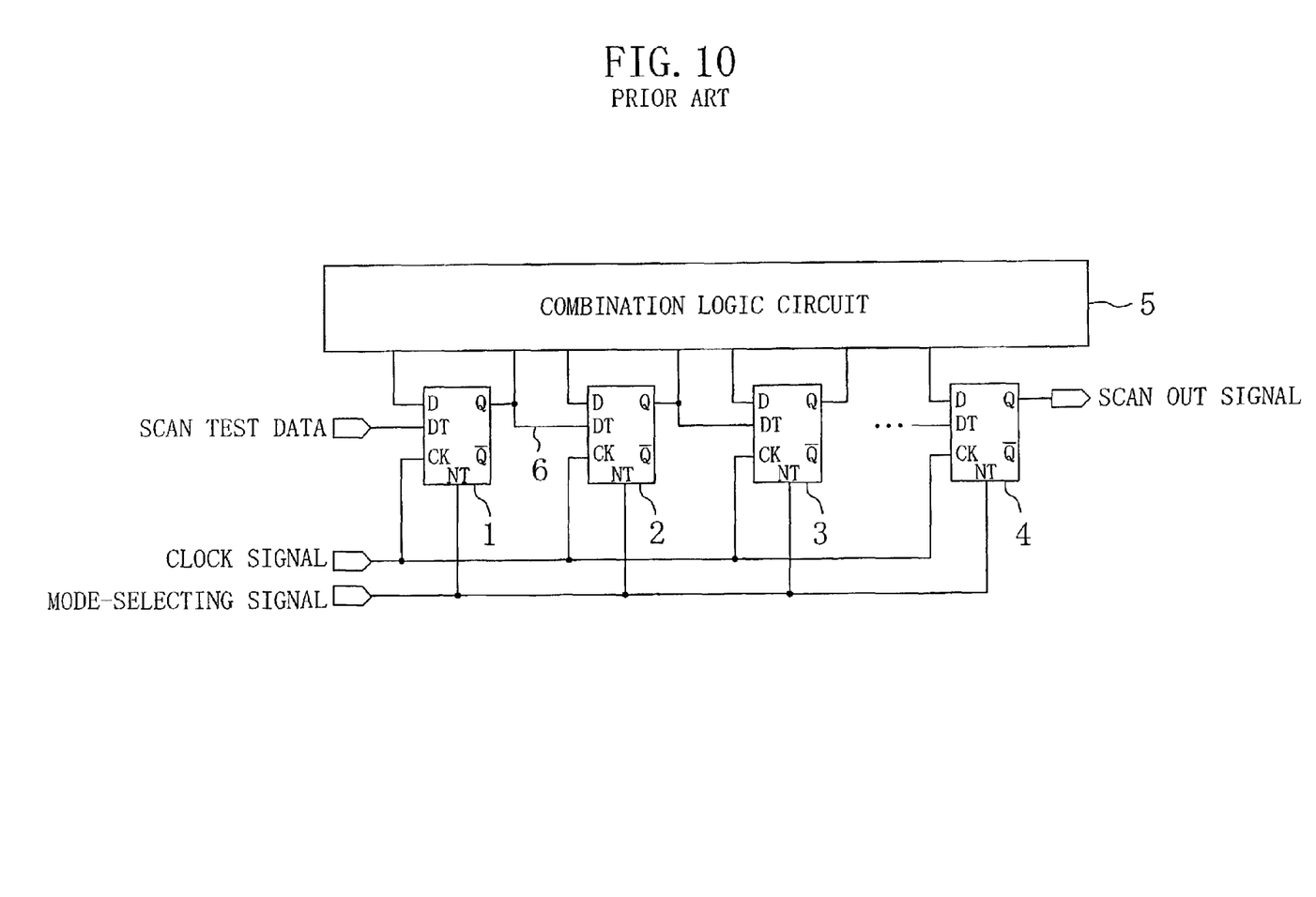
FIG. 10 is a block diagram showing the general configuration of a conventional scan test circuit.

FIG. 10 is a block diagram showing a scan test circuit used in conventional scan test design. In the figure, reference numerals 1, 2, 3, and 4 denote D-type flip-flop circuits for scan testing (hereafter referred to as D-FFs), and reference numeral 5 denotes a combination logic circuit. Output terminals Q of the D-FFs 1 to 4 are connected to the combination logic circuit 5 as well as to scan test data input terminals DT of the next stage D-FFs. Normal data input terminals D of the D-FFs 1 to 4 are connected to the combination logic circuit 5.

Figure 11:
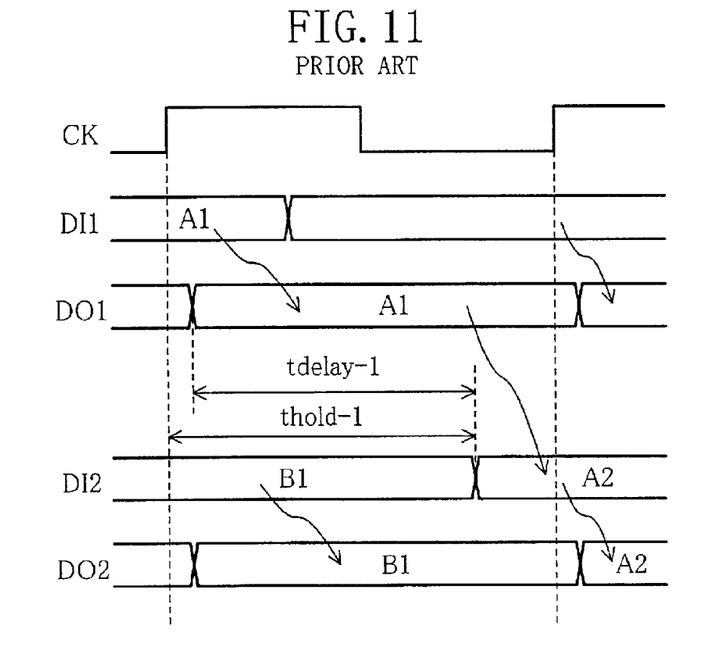
FIG. 11 is a timing chart showing the operation of the conventional scan test circuit in the normal operation mode.

FIG. 11 is a timing chart showing the operation of the scan test circuit of FIG. 10 in the normal operation mode. In the figure, reference character CK denotes clock signal that is inputted to clock input terminal CK of the D-FFs 1 to 4, reference character DI1 and DI2 denote signals that are inputted to the normal data input terminals D of the D-FFs 1 and 2 respectively, reference characters DO1 and DO2 respectively denote signals that are outputted from the output terminals Q of the D-FFs 1 and 2, reference characters A1, A2, and B1 denote data, reference character tdelay-1 denotes a signal delay time from the output terminal Q of the D-FF 1 to the normal data input terminal D of the D-FF 2, and reference character thold-1 denotes a data hold time of the D-FF 2.

Figure 12:
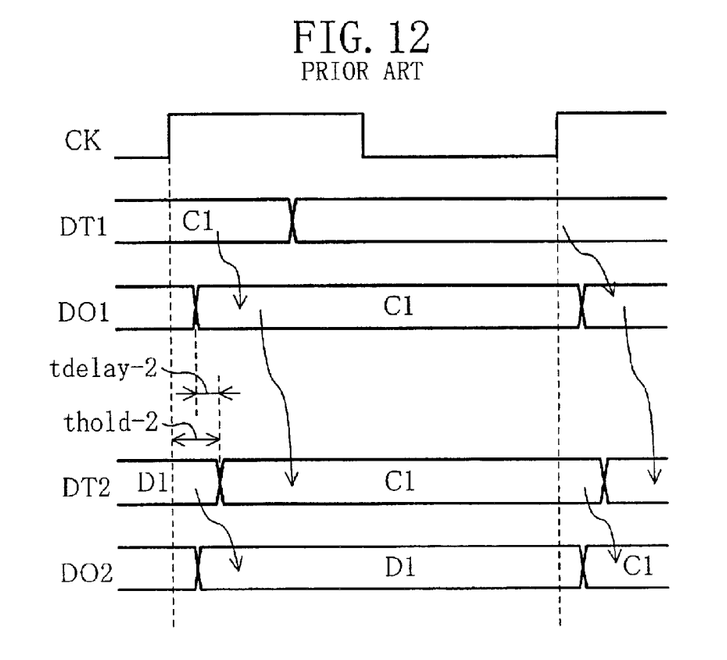
FIG. 12 is a timing chart showing the shifting operation of the conventional scan test circuit in the scan test mode.

FIG. 12 is a timing chart showing the shifting operation of the scan test circuit of FIG. 10 in the scan test mode. In the figure, reference character CK denotes clock signal that is inputted to clock input terminal CK of the D-FFs 1 to 4, reference character DT1 and DT2 respectively denote signals that are inputted to the scan test data input terminals DT of the D-FFs 1 and 2, reference characters DO0 and DO2 respectively denote signals that are outputted from the output terminals Q of the D-FFs 1 and 2, reference characters C1 and D1 denote data, reference character tdelay-2 denotes a signal delay time from the output terminal Q of the D-FF 1 to the scan test data input terminal DT of the D-FF 2, and reference character thold-2 denotes a data hold time of the D-FF 2.

In the normal operation mode, when clock signal CK changes, the D-FF 1 latches the data A1 and propagates the data to the output terminal Q and the D-FF 2 latches the data B1 and propagates the data to the output terminal Q. Here, a fter the signal delay time tdelay-1 has elapsed from the change of the data DO0 at the output terminal Q of the D-FF 1, the data DI1 at the normal data input terminal D of the D-FF 2 change. The signal delay time tdelay-1 is determined according to the internal configuration of the combination logic circuit 5.

Next, in the shifting operation of the scan test mode, when clock signal CK changes, the D-FF 1 latches the data C1 and propagates the data to the output terminal Q and the D-FF 2 latches the data D1 and propagates the data to the output terminal Q. Here, after the signal delay time tdelay-2 has elapsed from the change of the data DO1 at the output terminal Q of the D-FF 1, the data DT2 at the scan test data input terminal DT of the D-FF 2 change and a shift register operation is carried out. The signal delay time tdelay-2 is determined according to a wiring line delay time of a wiring line 6 for propagating scan test data that is disposed between the D-FF 1 and the D-FF 2. The wiring line for propagating scan test data that connects the two D-FFs is wired using an automatic placing and routing tool. Thus, a scan test function is obtained.

The above-described conventional configuration, however, has a problem as follows; concerning the two D-FFs 1 and 2, since the output terminal Q of the D-FF 1 is connected to the scan test data input terminal DT of the D-FF 2 only via the wiring line 6 for propagating scan test data, the signal delay time tdelay-2 of scan test data is short and, as a result, the D-FF 2 tends to cause hold errors of scan test data.

In addition, in the normal operation mode, data change at the output terminal Q of the D-FF 1 brings about data change also at the scan test data input terminal DT of the next stage D-FF 2, and consequently, transistors connected to the scan test data input terminal DT are caused to operate in the D-FF 2, consuming extra electric power, which is another problem.

Furthermore, in the two D-FFs, the wiring lines that connect the output terminal Q of the present D-FFs with the scan test data input terminal DT of the next stage D-FFs are wired in metal wiring line regions with the use of an automatic placing and routing tool, and therefore, the degree of congestion of wiring lines in this metal wiring line regions is high, which is still another problem.

SUMMARY OF THE INVENTION

It is an object to the present invention to effectively prevent hold errors of scan test data in the next stage scan flip-flop circuit so that output data from the present scan flip-flop circuit are properly held in the next stage scan flip-flop circuit.

In order to accomplish the foregoing and other objects, according to the present invention, the internal configuration of scan flip-flop circuits is modified to increase propagation delay time of scan test data from the present scan flip-flop circuit to the next stage scan flip-flop circuit.

Further, in the present invention, the wiring lines for propagating scan test data from the present stage to the next stage are disposed in advance in a combination logic circuit to be tested, thereby reducing the degree of congestion of wiring lines in metal wiring line regions when automatic placing and routing is carried out using an automatic placing and routing tool.

Accordingly, the present invention provides a scan flip-flop circuit for testing a combination logic circuit, the flip-flop circuit being connected to the combination logic circuit, comprising: an internal data holding circuit; a data input terminal for receiving data from the combination logic circuit and transferring the data to the internal data holding circuit; a data output terminal for receiving data from the internal data holding circuit and outputting the data to the combination logic circuit; a scan test data input terminal for receiving scan test data and transferring the scan test data to the internal data holding circuit; a scan test data output terminal for receiving scan test data from the internal data holding circuit and outputting the scan test data; and a driving element interposed between the internal data holding circuit and the scan test data output terminal and, when the scan test data output terminal is connected to another scan flip-flop circuit via a wiring line for propagating scan test data, controlling a propagation delay time of scan test data to be propagated from the internal data holding circuit to the other scan flip-flop circuit via the scan test data output terminal; wherein the driving element has a control terminal and stops driving by receiving a control signal having a predetermined potential at the control terminal except during scan testing, bringing the scan test data output terminal into a high impedance state; and except during scan testing, scan test data appearing at the scan test data output terminal are held.

The present invention also provides a scan test circuit for scan testing a combination logic circuit, comprising: at least a first and a second scan flip-flop circuits; each of the scan flip-flop circuits having: an internal data holding circuit; a data input terminal connected to the combination logic circuit; a data output terminal connected to the combination logic circuit; a scan test data input terminal; and a scan test data output terminal; wherein: the scan test data output terminal of the first scan flip-flop circuit is connected to the scan test data input terminal of the second scan flip-flop circuit via a wiring line for propagating scan test data; and the first scan flip-flop circuit has a driving element interposed between the internal data holding circuit and the scan test data output terminal; and the driving element controls a propagation delay time of scan test data to be propagated from the internal data holding circuit of the first flip-flop circuit to the scan test data input terminal of the second scan flip-flop circuit via the scan test data output terminal of the first flip-flop circuit.

Moreover, according to the present invention, in the above-described scan test circuit, the driving element of the first scan flip-flop circuit has a drive capability such that the propagation delay time is controlled such that the second scan flip-flop circuit does not cause hold errors of scan test data.

Further, according to the present invention, in the above-described scan test circuit, the internal data holding circuit of the first scan flip-flop circuit has another driving element for driving the data output terminal; and the driving element interposed between the internal data holding circuit and the scan test data output terminal has a drive capability lower than a drive capability of the other driving element.

Further, according to the present invention, in the above-described scan test circuit, in the first scan flip-flop circuit, the driving element interposed between the internal data holding circuit and the scan test data output terminal has a control terminal and stops driving by receiving a control signal having a predetermined potential at the control terminal except during scan testing, bringing the scan test data output terminal into a high impedance state; and except during scan testing, scan test data appearing at the scan test data output terminal are held.

The present invention also provides a scan test circuit for scan testing a combination logic circuit, comprising: at least a first and a second scan flip-flop circuits; each of the first and the second scan flip-flop circuits having: an internal data holding circuit; a data input terminal connected to the internal data holding circuit; a data output terminal connected to the internal data holding circuit; a scan test data input terminal; and a scan test data output terminal; wherein: the scan test data output terminal of the first scan flip-flop circuit is connected to the scan test data input terminal of the second scan flip-flop circuit via a wiring line for propagating scan test data; and the wiring line for propagating scan test data is disposed in a polysilicon layer or a diffusion layer.

Further, according to the present invention, in the above-described scan test circuit, the combination logic circuit comprises a plurality of logic macros having at least a first logic macro; the first logic macro is adjacently interposed between the first and the second scan flip-flop circuits; in the first and the second scan flip-flop circuits, the scan test data input terminal and the scan test data output terminal are respectively formed in the vicinity of both ends adjacent to the first logic macro; in a polysilicon layer or a diffusion layer of the first logic macro, the wiring line for propagating scan test data is formed in advance so as to connect the scan test data output terminal of the first scan flip-flop circuit and the scan test data input terminal of the second scan flip-flop circuit.

In addition, according to the present invention, in the above-described scan test circuit, the scan test data input terminals and the scan test data output terminals formed in the first and the second scan flip-flop circuits as well as the wiring lines formed in the first logic macro are all disposed at the same positions spaced at a predetermined distance from an end that is other than the both ends adjacent to the first logic macro.

In addition, the present invention also provides a logic macro comprised in a combination logic circuit scan-tested using at least a first and a second scan flip-flop circuits, wherein: in a polysilicon layer or a diffusion layer of the logic macro, a wiring line for propagating scan test data is formed in advance, the wiring line connecting a scan test data output terminal comprised in the first scan flip-flop circuit and a scan test data input terminal comprised in the second scan flip-flop circuit.

The present invention also provides a method for laying out a scan test circuit for scan testing a combination logic circuit having at least a first logic macro using at least a first and a second scan flip-flop circuits, comprising: forming a wiring line for propagating scan test data in a polysilicon layer or a diffusion layer of the first logic macro in advance, the wiring line connecting a scan test data output terminal comprised in the first scan flip-flop circuit and a scan test data input terminal comprised in the second scan flip-flop circuit; and thereafter, connecting the data input terminals and the data output terminals comprised in the first and the second scan flip-flop circuits with the wiring line for propagating scan test data that has been formed in the first logic macro by disposing the first logic macro between the first and the second flip-flop circuits so as to be adjacent to each other by automatic placing and routing.

Further, according to the present invention, in the above-described method for laying out the scan test circuit, in the first and the second scan flip-flop circuits each having the same vertical length as the first logic macro, the scan test data input terminal and the scan test data output terminal each extending to an end along the horizontal direction are formed in advance in a position spaced at a predetermined distance from a side portion with respect to the vertical direction; and in the first logic macro, both ends of the wiring line for propagating scan test data that is formed in the polysilicon layer or a diffusion layer are placed in advance in a position spaced at the predetermined distance from a side portion with respect to the vertical direction so as to extend to ends along the horizontal direction.

Thus, according to the present invention, with the configurations described above, a scan test data output terminal is separately provided in the scan flip-flop circuit, and the drive capability for the scan test data from the output terminal is adjustable by setting the drive capability of the driving element connected to the output terminal. Therefore, data propagation delay time until the scan test data have been propagated to the next stage flip-flop circuit for scan test can be suitably adjusted, and hold errors of scan test data do not easily occur in the shifting operation during scan testing. Moreover, the driving element for adjusting data propagation delay time is provided within the scan flip-flop circuit, and therefore, it is unnecessary to provide a delay element on a wiring line for propagating scan test data that connects the present stage and the next stage scan flip-flop circuits.

In particular, according to the present invention, when not in the shifting operation of scan testing, for example, when in a normal operation, the driving element that drives the scan test data output terminal stops its driving, bringing the scan test data output terminal into a high impedance state, and therefore, the potential of the wiring line for propagating scan test data through which the scan test data are propagated from the output terminal is fixed as well as the operation of the internal transistors that are connected to the scan test data input terminal of the next stage scan flip-flop circuit and the like. Thus, power consumption is correspondingly reduced.

Furthermore, according to the present invention, the wiring line for propagating scan test data that connects the present stage and the next stage of the scan flip-flop circuits is a wiring line formed in a polysilicon layer or a diffusion layer, which has a higher resistance and a higher capacitance than those of the metal wiring lines in the metal wiring line regions. Therefore, data propagation delay time of scan test data can be set long, so hold errors do not easily occur. In addition, since wiring lines for propagating scan test data are not provided in the metal wiring line regions, the degree of congestion of wiring lines in the metal wiring line regions is reduced.

In particular, according to the present invention, the wiring line for propagating scan test data that connects the present stage and the next stage scan flip-flop circuits is formed in advance in a logic macro, and as a consequence, by merely disposing the logic macro between the present stage and the next stage scan flip-flop circuits so as to be adjacent to one another, the data output terminal of the present stage flip-flop circuit can be connected to the scan test data input terminal of the next stage flip-flop circuit, thus eliminating the need for wiring the wiring line for propagating scan test data using an automatic placing and routing tool.

DETAILED DESCRIPTION OF THE INVENTION

With reference to the attached drawings, preferred embodiments of the present invention are detailed below.

Embodiment 1

A scan test circuit according to Embodiment 1 of the present invention is detailed with reference to FIGS. 1 and 2.

Figure 1:
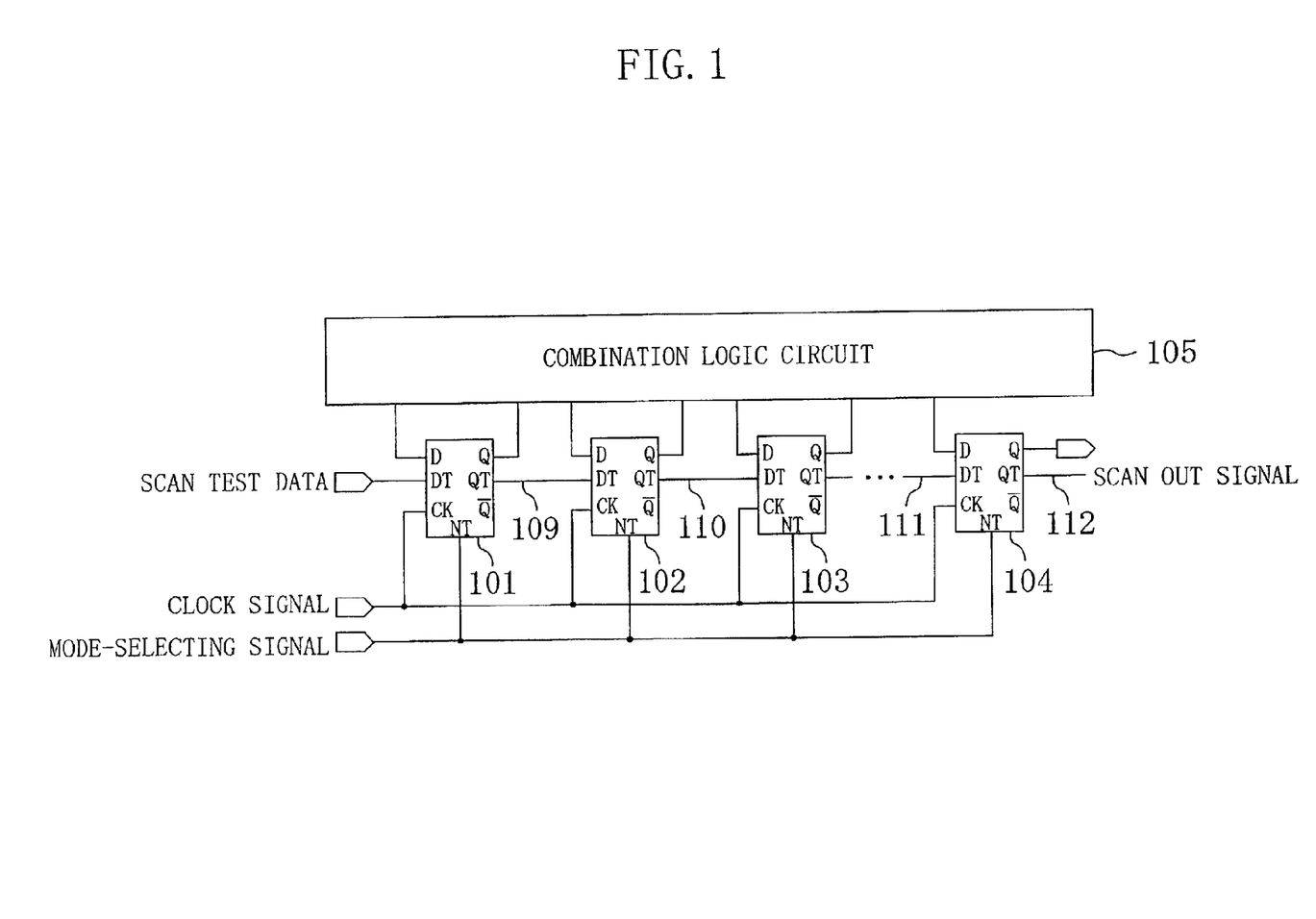
FIG. 1 is a block diagram showing the general configuration of a scan test circuit according to Embodiment 1 of the present invention.

FIG. 1 is a block diagram showing a scan test circuit according to the present embodiment. In the figure, reference numeral 105 denotes a combination logic circuit having a multiplicity of logic macros, and reference numerals 101, 102, 103, and 104 denote D type flip-flop circuits (hereafter abbreviated as D-FFs) for scan testing. Each of the D-FFs 101 to 104 has the same internal configuration and has a data input terminal D (D terminal), a data output terminal Q (Q terminal), an inverted data output terminal /Q (/Q terminal), a clock signal input terminal CK (CK terminal), and a mode signal input terminal NT (NT terminal), and in addition, a scan test data input terminal DT (DT terminal) and a scan test data output terminal QT (QT terminal). In each of the D-FFs 101 to 104, the D terminal and the Q terminal are connected to the combination logic circuit 105, and the CK terminal is supplied with clock signals whereas the NT terminal is supplied with mode-selecting signals. The Q terminal of the final stage D-FF 104 is not connected to the combination logic circuit 105.

In addition, the D-FFs 101 to 104 are lined up in the horizontal direction of the figure with n stages (n is an integer and n≧2), and the DT terminal of the first stage D-FF 101 is supplied with scan test data. The DT terminals of the second, the third, and the n-th stage D-FFs 102 to 104 are connected to the QT terminals of the previous stage D-FFs 101 to 103 . . . via wiring lines 109 to 111 for propagating scan test data, and they receive scan test data from the previous stage D-FFs 101 to 103 . . . The QT terminal of the final stage (n-th stage) D-FF 104 is connected to a wiring line 112, and the finally obtained data (scan out signal) are outputted to the wiring line 112.

Taking the first stage D-FF 101 as an example, the internal configuration is described with reference to FIG. 2. As shown in the figure, the D-FF 101 has an internal data holding circuit 106. The holding circuit 106 permits the input of data supplied from the D terminal when the mode-selecting signal inputted to the NT terminal is at L level, which is a normal mode, whereas when the mode-selecting signal is at H level, which is a scan test mode, the holding circuit 106 permits the input of scan test data supplied from the DT terminal. Further, the data supplied from the D terminal or the DT terminal are captured inside when the clock signal inputted to the CK terminal is at L level, and thereafter, when the clock signal turns to H level, the data are held and are subsequently outputted from the Q terminal while inverted data, which are the inversion of those data, are outputted from the /Q terminal.

Figure 2:
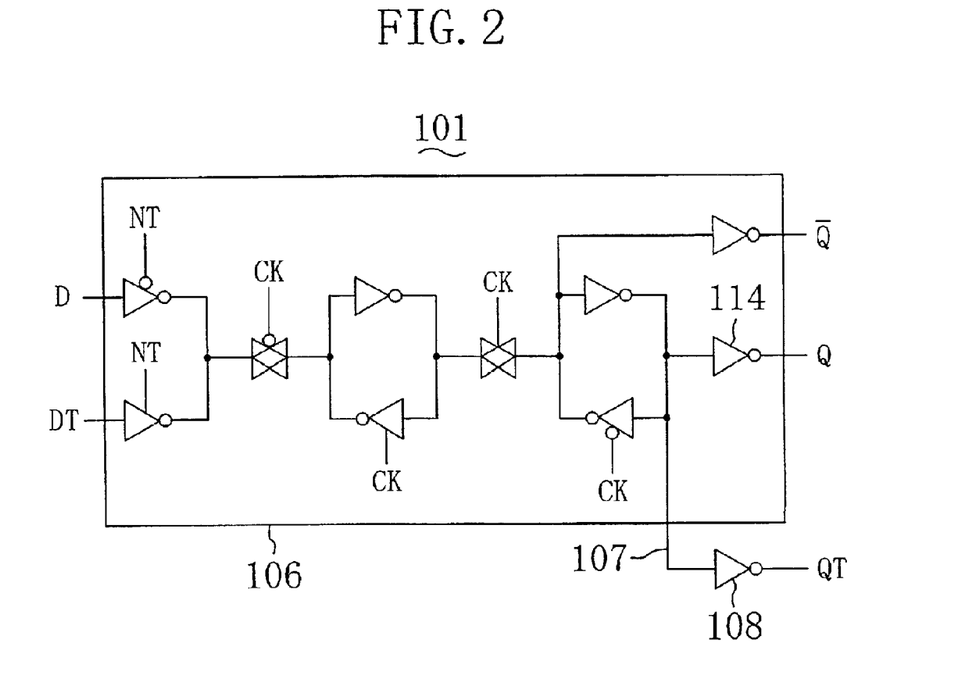
FIG. 2 shows the internal configuration of a scan flip-flop circuit that is provided in the embodiment.

As shown in FIG. 2, the D-FF 101 is additionally provided with a buffer (driving element) 108. The buffer 108 is disposed on a wiring line 107 connecting the internal data holding circuit 106 and the QT terminal. When the QT terminal is connected to the next stage D-FF 102 via a wiring line 109 (see FIG. 1) for propagating scan test data, the buffer 108 controls a propagation delay time with which the scan test data held in the internal data holding circuit 106 are transferred to the DT terminal of the next stage D-FF 102 via the QT terminal and the wiring line 109. For this purpose, the drive capability of the buffer 108 is set so that when scan test data are propagated from the QT terminal of the present stage D-FF 101 to the DT terminal of the next stage D-FF 102 via the wiring line 109, the next stage D-FF 102 does not cause hold errors of scan test data. Specifically, the drive capability of the buffer 108 may be set to be lower than the drive capability of the other buffer (other driving element) 114 connected to the Q terminal, that is, the size of the transistor that constitutes the buffer 108 may be smaller than that of the transistor that constitutes the other buffer 114.

Accordingly, in the scan test circuit according to the present embodiment, during the shifting operation of scan testing, the D-FFs 101, 102, 103, and 104 latch scan test data from the DT terminal on a rise of the clock signal and propagate the latched data to the Q terminal via the buffer 114 and to the QT terminal via the buffer 108. Since the drive capability of the buffer 108 is set smaller than the drive capability of the buffer 114, the propagation delay time from the rise of the clock signal CK to the change of the scan test data at the QT terminal is long. Thus, the signal propagation delay time, with which these scan test data are propagated from the QT terminal to the DT terminal of the next stage D-FF 102 (or 103, 104) via the wiring line 109 (or 110, 111) becomes long, and as a consequence, a sufficient hold time for the scan test data in the next stage D-FF is ensured.

Embodiment 2

Next, Embodiment 2 according to the present invention is described with reference to FIGS. 3 and 4. In the present embodiment, only the internal configuration of the flip-flop circuit (D-FF) for scan testing shown in FIG. 1 is different from Embodiment 1. Thus, in the present embodiment, the description of the general configuration of the scan test circuit is omitted because it is the same as that shown in FIG. 1, and only the internal configuration of the D-FF is detailed.

Figure 3:
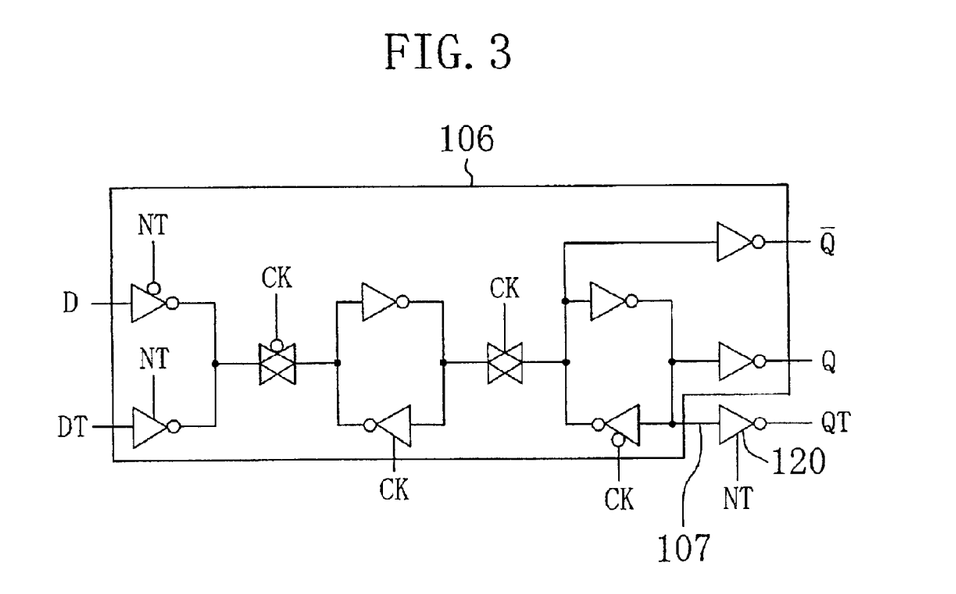
FIG. 3 shows the internal configuration of a scan flip-flop circuit that is provided in a scan test circuit according to Embodiment 2 of the present invention.

FIG. 3 shows the internal configuration of a D-FF according to the present embodiment. In the figure, the internal data hold circuit 106 has the same configuration as that shown in FIG. 2 except that, whereas the buffer 108 is provided as the driving element shown in FIG. 2, the driving element shown in FIG. 3 is composed of a tristate buffer 120. The tristate buffer 120 is disposed on the wiring line 107 that connects the internal data holding circuit 106 and the QT terminal.

Figure 4:
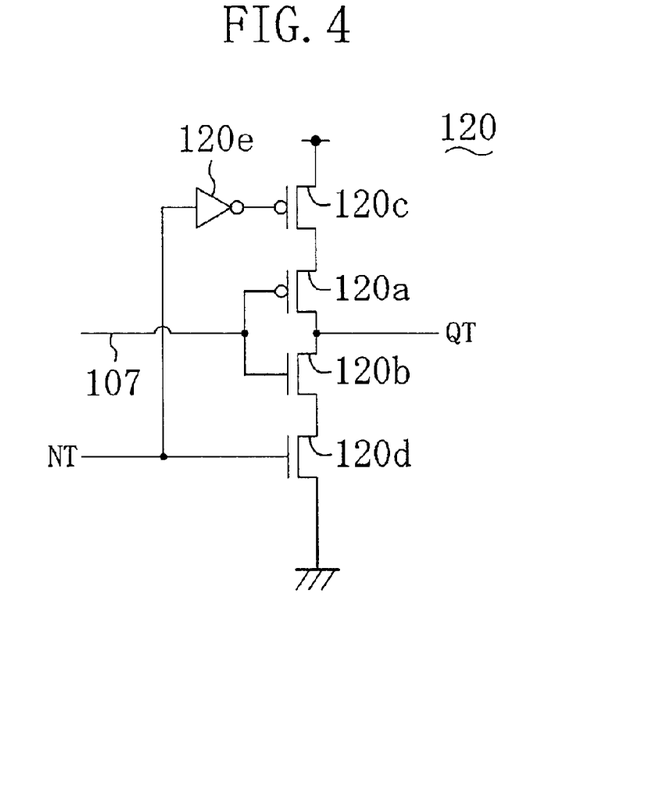
FIG. 4 shows the internal configuration of a tristate buffer provided in the scan flip-flop circuit.

The internal configuration of the tristate buffer 120 is shown in FIG. 4. As shown in the figure, the tristate buffer 120 has a p-type transistor 120*a* and an n-type transistor 120*b* connected serially and interposed between the wiring line 107 and the QT terminal so that they constitute an inverter, and other p-type and n-type transistors 120*c* and 120*d* that connect the inverter to a power supply and a ground. The gate of the p-type transistor 120*c* is connected to the NT terminal (control terminal) via an inverter 120*e*, whereas the gate of the n-type transistor 120*d* is directly connected to the NT terminal. When in the scan test mode (when the mode-selecting signal inputted to the NT terminal, serving as a control signal, is at H level), the other p-type and n-type transistors 120*c* and 120*d* are turned on so that the transistors 120*a* and 120*b* that constitute the inverter can be operated, whereas when in the normal mode (when the mode-selecting signal is at L level), the other p-type and n-type transistors 120*c* and 120*d* are turned off so that the QT terminal is brought into a high impedance state (floating state) in order to fix the output data from the QT terminal either to L level or to H level regardless of the data level (L level or H level) in the internal data holding circuit 106 during the normal mode.

Thus, in the scan test circuit according to the present embodiment, when in the scan test mode, in which the mode-selecting signal inputted to the NT terminal is at H level, the scan test data inputted to the DT terminal is propagated to both the Q terminal and the QT terminal on a rise of the clock signal, but when in the normal mode, in which the mode-selecting signal is at L level, since the tristate buffer 120 brings the QT terminal into a high impedance state, the output data at the QT terminal is fixed at L level or H level. Thus, in the normal mode, it is possible to fix the potentials of the wiring lines 109 to 111 for propagating scan test data that connect the D-FFs 101 to 104, as well as operations of the internal transistors connected to the DT terminals of the D-FFs 102 to 104 and the like, thereby achieving reduction in power consumption.

Embodiment 3

Next, a scan test circuit according to Embodiment 3 of the present invention is detailed with reference to FIGS. 5 and 6. In the present embodiment as well, only the internal configuration of the scan flip-flop circuit (D-FF) differs from Embodiment 1. Therefore, the description of the general configuration of the scan test circuit is omitted and only the internal configuration of the D-FF is detailed.

Figure 5:
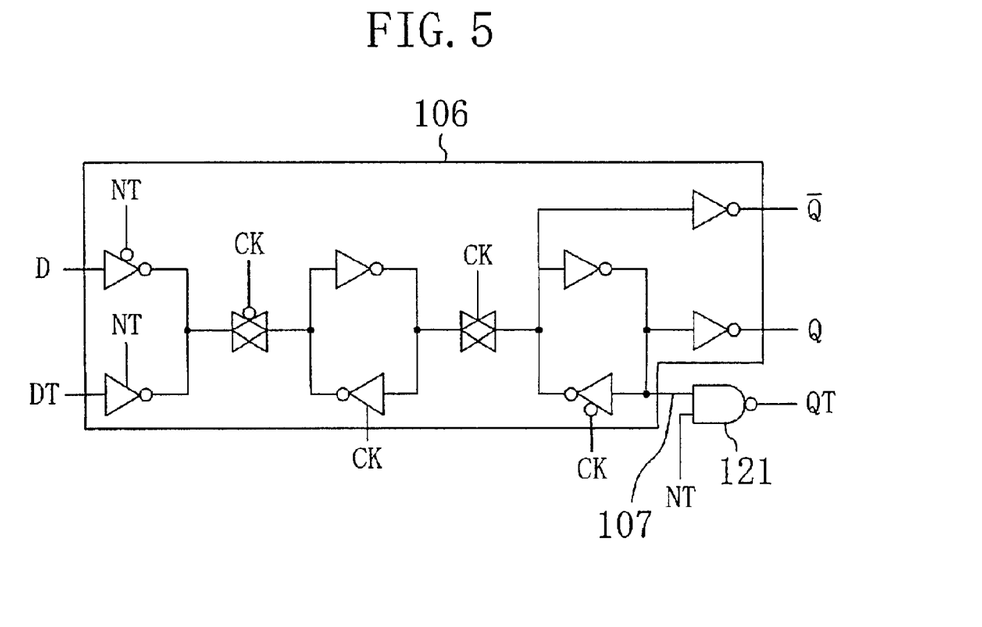
FIG. 5 shows the internal configuration of a flip-flop circuit provided in a scan test circuit according to Embodiment 3 of the present invention.
Figure 6:
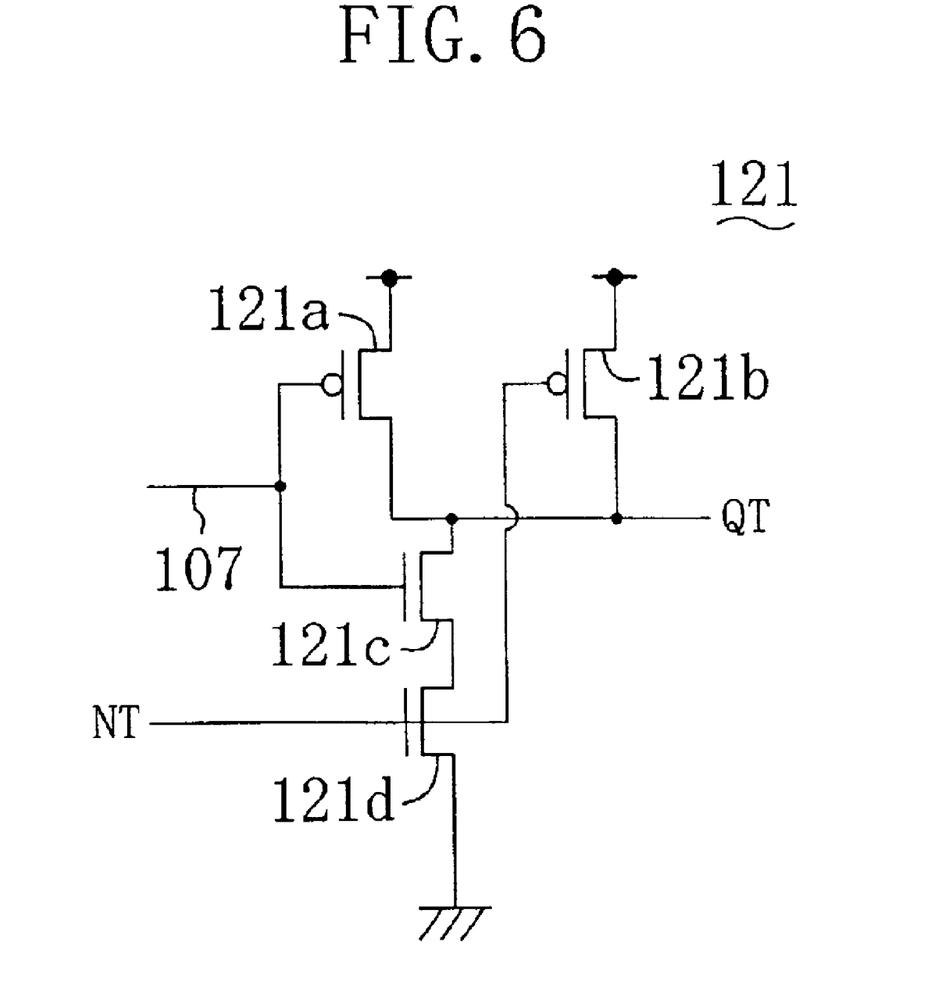
FIG. 6 shows the internal configuration of a two-input NAND gate provided in the scan flip-flop circuit.

FIG. 5 shows the internal configuration of a D-FF according to the present embodiment. In the D-FF shown in the figure, the tristate buffer 120, serving as the driving element provided in the D-FF of FIG. 3, which shows the foregoing embodiment 2, is replaced with a two-input NAND gate 121. The two-input NAND gate 121 receives data from the internal data holding circuit 106 via the wiring line 107 as well as the mode-selecting signal from the NT terminal. FIG. 6 shows the internal configuration of the two-input NAND gate 121, which is provided with two p-type transistors 121*a* and 121*b* and two n-type transistors 121*c* and 121*d*. In the scan test mode (when the mode-selecting signal is at H level), the two-input NAND gate 121 changes the signal level at the QT terminal into L level or H level in response to the data from the internal data holding circuit 106, whereas in the normal mode (when the mode-selecting signal is at L level), it forces the signal level at the QT terminal to be fixed at H level by turning on the p-type transistor 121*b*.

Thus, in the scan test circuit according to the present embodiment, when in the scan test mode, in which the mode-selecting signal inputted to the NT terminal is at H level, the scan test data that have been inputted to the DT terminal are transferred to both the Q terminal and the QT terminal on a rise of the clock signal. On the other hand, when in the normal mode, in which the mode-selecting signal is at L level, the output from the two-input NAND gate 121 is fixed at H level, and therefore, the signal level of the QT terminal is fixed at H level, regardless of the data that are inputted to the terminal D. Consequently, as is the case in the foregoing embodiment 2, it is possible to fix the potential of the QT terminal when in the normal mode and to achieve reduction in power consumption.

Embodiment 4

In the following, a logic macro, a scan test circuit, and a method for laying out the scan test circuit according to Embodiment 4 of the present invention are discussed with reference to FIGS. 7 to 9.

Figure 7:
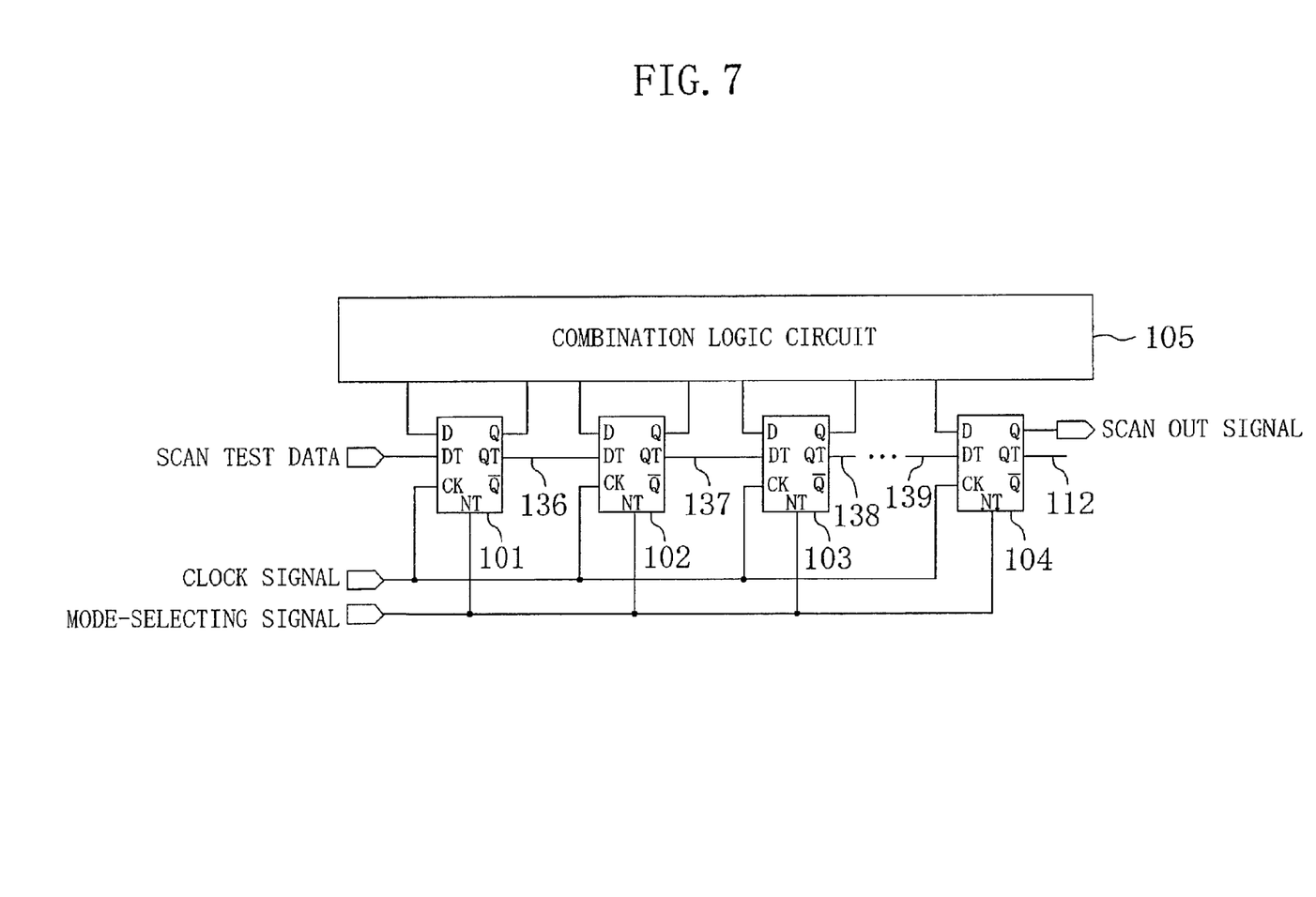
FIG. 7 is a block diagram showing the general configuration of a scan test circuit according to Embodiment 4 of the present invention.

FIG. 7 shows a block diagram representing a scan test circuit according to the present embodiment. The scan test circuit shown in the figure has the same general configuration and the configuration of the wiring lines as shown in FIG. 1, so the detailed description thereof is omitted. The differences are that the wiring lines 136, 137, 138, and 139 for propagating scan test data, which connect the QT terminals of D-FFs and the D terminals of the next stage D-FFs, are wiring lines that are formed in the polysilicon layer or the diffusion layer. In the present embodiment, of n stages of D-FFs 101 to 104, the first D-FF and the second D-FF represent two arbitrary D-FFs that are the present stage D-FF and the next stage D-FF (for example, D-FFs 101 and 102).

In the present embodiment, when the mode-selecting signal is L level, that is, when in the normal mode, data from the combination logic circuit 105 are inputted and held in the D-FFs 101 to 103 but not in the final stage D-FF 104, and, in the next period of the clock signal, the retained data are outputted from the Q terminal to the combination logic circuit 105.

On the other hand, when the mode-selecting signal is H level, that is, when in the scan test mode, n stages of D-FFs 101 to 104 carry out a shift register operation in which the scan test data that have inputted into the DT terminal of the first stage D-FF 101 are sequentially shifted to the next stage D-FFs at each clock signal period. Here, because the wiring lines 136 to 139 for propagating scan test data that connect the QT terminals of the D-FFs and the DT terminals of the next stage D-FFs are formed in a polysilicon layer or a diffusion layer, the wiring resistance and the wiring capacitance of these wiring lines 136 to 139 are large. Consequently, it is possible to ensure a relatively long hold time in each D-FF, which is from the time when the clock signal has changed to rise until the data have been propagated through these wiring lines to the DT terminal of the next stage D-FF and the data change at the DT terminal.

Next, a method for laying out a scan test circuit according to the present embodiment is specifically detailed with reference to FIGS. 8 and 9.

Figure 8A:
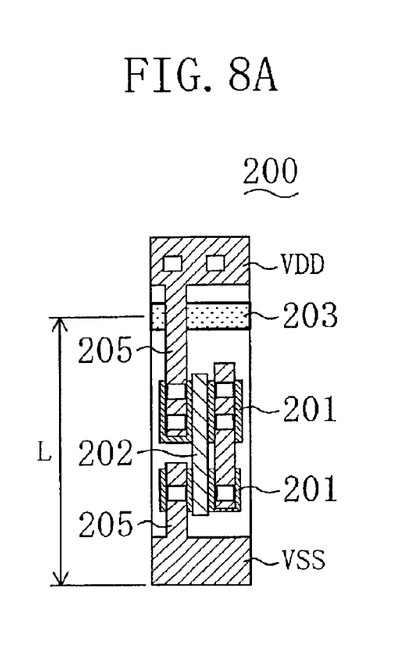
FIG. 8A shows the layout configuration of a logic macro provided in the scan test circuit.
Figure 8B:
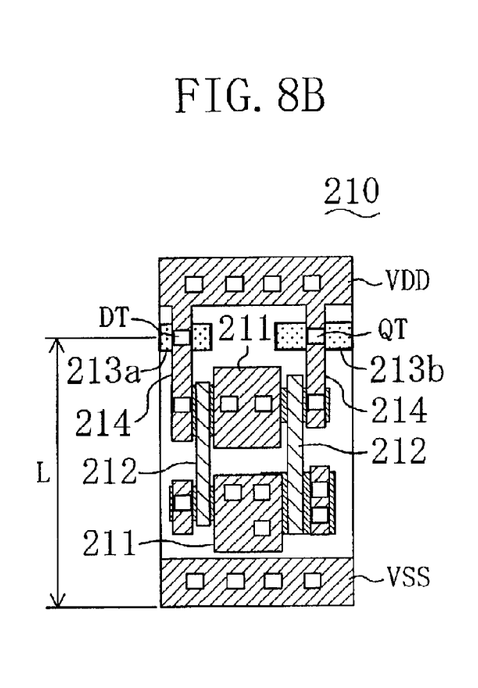
FIG. 8B shows the layout configuration of a scan flip-flop circuit.
Figure 8C:
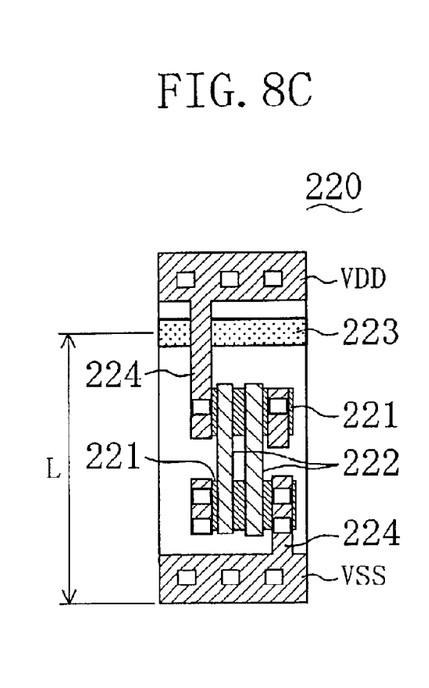
FIG. 8C shows the layout configuration of another logic macro.
Figure 9:
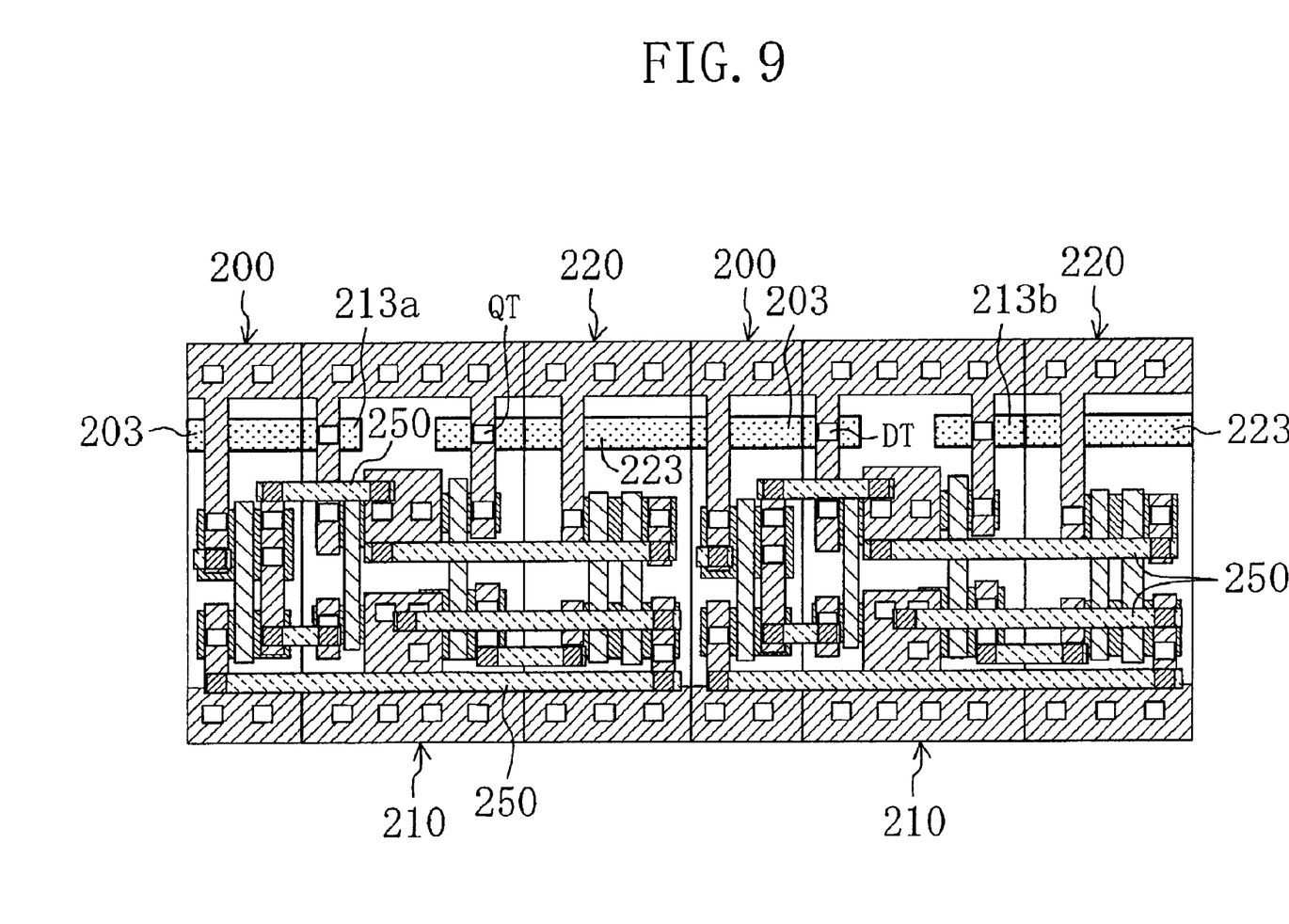
FIG. 9 is a layout diagram showing a scan test circuit configured using the logic macros and the scan flip-flop circuit shown in FIGS. 8A to 8C.

According to the present embodiment, FIG. 8A shows an example of one layout configuration of a number of logic macros that constitute a combination logic circuit, FIG. 8B shows a specific example of the layout configuration of a D-FF, and FIG. 8C shows another example of one layout configuration of a number of logic macros that constitute the combination logic circuit.

In a logic macro (first logic macro) 200 shown in FIG. 8A, reference numeral 201 denotes a diffusion region and reference numeral 202 denotes a gate. Reference numeral 203 denotes a wiring line for propagating scan test data that is formed in advance in the logic macro 200 and extends along the horizontal direction of the figure to the ends on both sides. The wiring line 203 for propagating scan test data is formed in a diffusion layer in which the diffusion region 201 has been formed or a polysilicon layer in which the gate 202 is formed. The diffusion layer or the polysilicon layer is a layer that is not used in automatic routing using an automatic placing and routing tool. In FIG. 8A, reference character VDD denotes a power supply line, reference character VSS denotes a ground line, reference numeral 205 denotes intra-macro wiring lines that are formed in advance in a wiring line layer located in the same layer as the power supply line VDD and the ground line VSS but above the polysilicon layer.

In a logic macro (first logic macro) 220 shown in FIG. 8C as well, a diffusion region 221, a gate 222, a wiring line 223 for propagating scan test data that is formed in the diffusion layer or the polysilicon layer, a power supply line VDD, a ground line VSS, and intra-macro wiring lines 224 are formed in a similar manner. The wiring line 223 for propagating scan test data extends along the horizontal direction of the figure to the ends of both sides.

In a D-FF 210 shown in FIG. 8B, a diffusion region 211, a gate 212, a power supply line VDD, a ground line VSS, intra-macro wiring lines 214, a DT terminal, and a QT terminal are formed in a similar manner. To the DT terminal and the QT terminal, two wiring lines 213*a* and 213*b* for propagating scan test data that are formed in the polysilicon layer or the diffusion layer are connected respectively, and these wiring lines 213*a* and 213*b* extend along the horizontal direction (width direction) of the figure and are positioned near the ends of both sides.

Here, the logic macros 200 and 220 and the D-FF 210 along the vertical direction of the figures are set the same length. The widths of the wiring lines 203, 223, 213*a*, and 213*b* for propagating scan test data in the logic macros 200 and 220 and the D-FF 210 are set to be the same, and distances L from one side end with respect to the vertical direction (the lower end in the figure) to the central positions of these wiring lines 203, 223, 213*a*, and 213*b* are set to be the same distance.

Next, a method for laying out a scan test circuit using the logic macros 220 and 220 and the D-FF 210 is described with reference to FIG. 9.

In the figure, two logic macros 200 shown in FIG. 8A, two logic macros 220 shown in FIG. 8C, and two D-FFs 220 shown in FIG. 8B are used as in the manner shown in the figure so that these are laid out in the horizontal direction of the figure and that the logic macros 200 and the logic macros 220 are disposed so as to be adjacent to one another and the D-FFs 220 are adjacently disposed on the left sides of the logic macros 220 in the figure and on the right sides of the logic macros 200 in the figure.

As is understood from the figure, by merely disposing the logic macros 200 and 220 and two D-FFs 210 so that their ends along the vertical direction of the figure are in contact to one another, the QT terminal of the D-FF 210 is connected to the DT terminal of the next stage D-FF via the wiring lines 203 and 223 for propagating scan test data in the logic macros 200 and 220. Therefore, after laying out these logic macros 200 and 220 and D-FFs 210 with an automatic placing and routing tool, it is only necessary to wire a number of wiring lines 250 for normal operation (the wiring lines shown by broken lines inclined downwardly to the right in the figure) using an automatic placing and routing tool, and it is not necessary to lay out the wiring lines for propagating scan test data that connect two D-FFs 210 in the metal wiring line regions of the wiring lines 250 for normal operation.

Figure 13A:
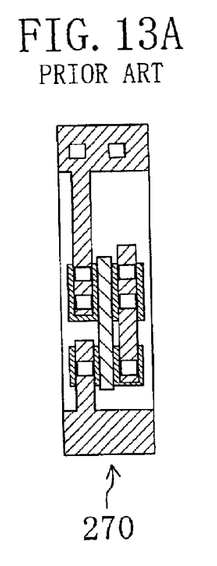
FIG. 13A shows the layout configuration of a conventional logic macro provided in the conventional scan test circuit.
Figure 13B:
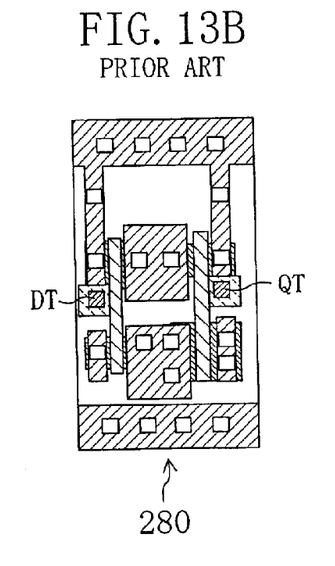
FIG. 13B shows the layout configuration of a conventional scan flip-flop circuit.
Figure 13C:
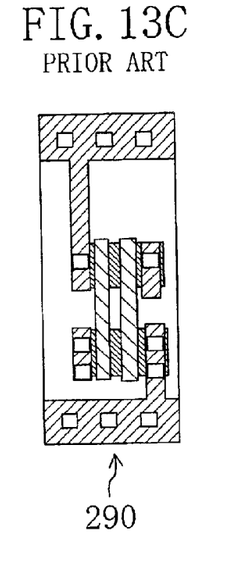
FIG. 13C shows the layout configuration of another conventional logic macro.
Figure 14:
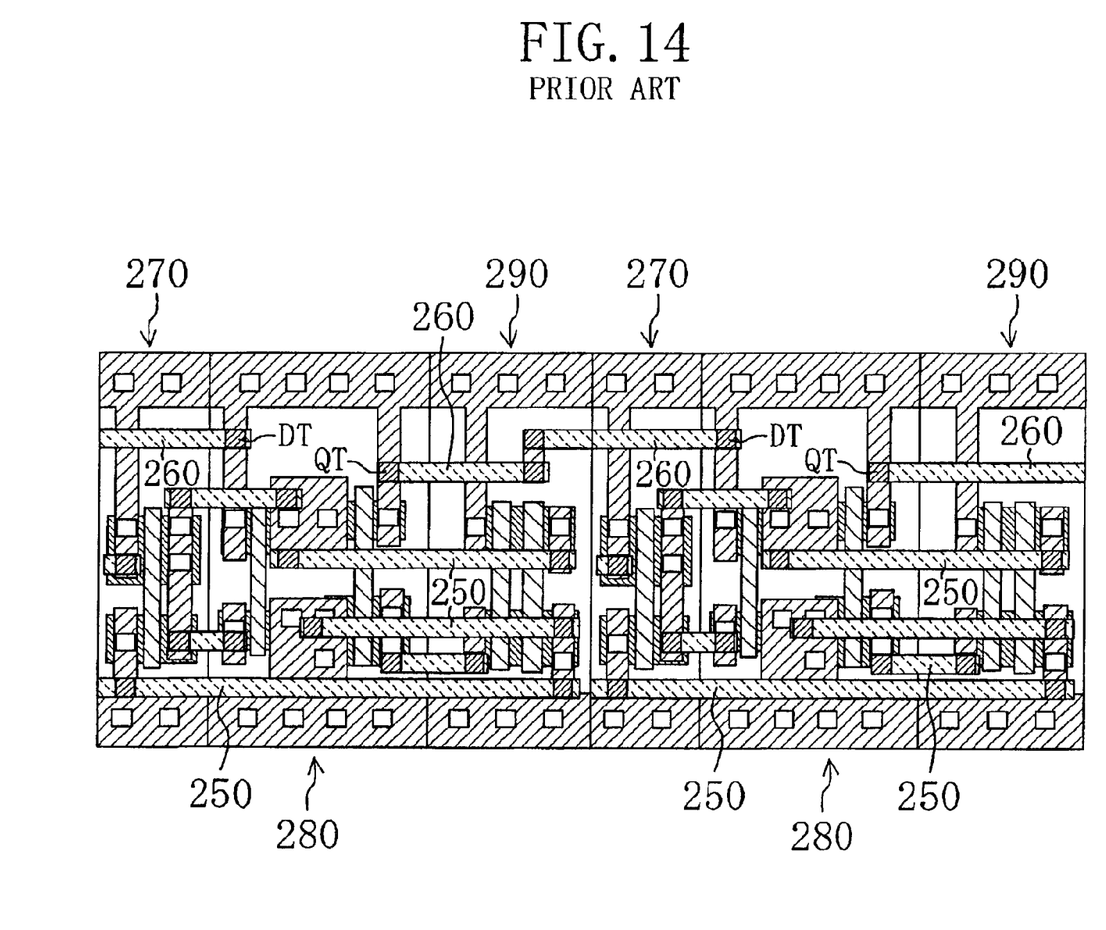
FIG. 14 is a layout diagram showing a scan test circuit configured using the logic macros and the scan flip-flop circuit shown in FIGS. 13A to 13C.

FIGS. 13 and 14 show conventional examples that are comparable to the present embodiment. FIG. 13A is a conventional logic macro 270, FIG. 13B shows a conventional D-FF 280, and FIG. 13C shows another conventional logic macro 290. These logic macros and D-FF correspond to the logic macro 200, the D-FF 210, and the logic macro 220 according to the present embodiment, which are shown in FIGS. 8A, 8B, and 8C, and the differences are that, unlike the present embodiment, the wiring lines 203, 213a, 213b, and 223 for propagating scan test data are not provided. Thus, when a scan test circuit is constructed using these conventional logic macros 270, 290, and the D-FF 280, the resulting layout becomes as shown in FIG. 14. In this layout, as is understood from the figure, it is necessary to separately provide wiring lines 260 for propagating scan test data in the wiring line regions of wiring lines 250 for normal operation using an automatic placing and routing tool. Accordingly, when a comparison is made between the conventional scan test circuit shown in FIG. 14 and the scan test circuit according to the present embodiment as shown in FIG. 9, it becomes clear that the present embodiment effectively reduces the degree of congestion of wiring lines in the metal wiring line regions of the wiring lines 250 for normal operation.

It should be noted that Embodiment 4 may of course be combined with the foregoing embodiments 1 to 3.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for laying out a scan test circuit for scan testing a combination logic circuit having at least a first logic macro using at least a first scan flip-flop circuit and a second scan flip-flop circuit, the method comprising:

forming a wiring line for propagating scan test data in a polysilicon layer or a diffusion layer of the first logic macro in advance, the wiring line connecting a scan test data output terminal included in the first scan flip-flop circuit and a scan test data input terminal included in the second scan flip-flop circuit; and thereafter, connecting the data input terminal and the data output terminal included in the first scan flip-flop circuit and the second scan flip-flop circuit with the wiring line for propagating the scan test data that has been formed in the first logic macro by disposing the first logic macro between the first and the second flip flop circuits so as to be adjacent to both the first flip flop circuit and the second flip flop circuit by automatic placing and routing, wherein:

in the first and the second scan flip-flop circuits each having the same vertical length as the first logic macro, the scan test data input terminal and the scan test data output terminal each extending to an end along the horizontal direction are formed in advance in a position spaced at a predetermined distance from a side portion with respect to the vertical direction; and in the first logic macro, both ends of the wiring line for propagating the scan test data that is formed in the polysilicon layer or a diffusion layer are placed in advance in a position spaced at the predetermined distance from a side portion with respect to the vertical direction so as to extend to ends along the horizontal direction.

* * * * *